United States Patent
Cho et al.

(10) Patent No.: US 10,211,388 B2
(45) Date of Patent: Feb. 19, 2019

(54) PIEZOELECTRIC DEVICE AND METHOD OF MANUFACTURING THE SAME

(71) Applicant: SAMSUNG ELECTRONICS CO., LTD., Suwon-si (KR)

(72) Inventors: Kyung-hoon Cho, Yongin-si (KR); Hwi-yeol Park, Ansan-si (KR); Jin S. Heo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1077 days.

(21) Appl. No.: 14/329,049

(22) Filed: Jul. 11, 2014

(65) Prior Publication Data

US 2015/0076966 A1    Mar. 19, 2015

(30) Foreign Application Priority Data

Sep. 17, 2013 (KR) .......................... 10-2013-0112066

(51) Int. Cl.
*H01L 41/04* (2006.01)
*H01L 41/047* (2006.01)
*H01L 41/113* (2006.01)

(52) U.S. Cl.
CPC ........ *H01L 41/047* (2013.01); *H01L 41/0475* (2013.01); *H01L 41/1136* (2013.01); *Y10T 29/42* (2015.01)

(58) Field of Classification Search
CPC . H01L 41/1136; H01L 41/047; H01L 41/0475
USPC ....... 310/328, 330, 364–365, 332, 331, 319, 310/339
See application file for complete search history.

(56) References Cited

U.S. PATENT DOCUMENTS

| | | | | |
|---|---|---|---|---|
| 1,782,117 | A * | 11/1930 | Cady | H03H 9/0207 310/321 |
| 4,365,182 | A * | 12/1982 | Ballato | H03H 9/566 310/361 |
| 4,409,711 | A * | 10/1983 | Ballato | H03H 9/56 29/25.35 |
| 7,535,155 | B2 | 5/2009 | Ishikawa | |
| 2008/0252174 | A1 * | 10/2008 | Mohammadi | G01L 1/16 310/319 |

FOREIGN PATENT DOCUMENTS

| | | |
|---|---|---|
| JP | 2000-166260 A | 6/2000 |
| JP | 5326143 B2 | 10/2013 |
| KR | 10-0318245 B1 | 12/2001 |

\* cited by examiner

*Primary Examiner* — Thomas Dougherty
*Assistant Examiner* — Karen B Addison
(74) *Attorney, Agent, or Firm* — Sughrue Mion, PLLC

(57) ABSTRACT

A piezoelectric device and a method of manufacturing a piezoelectric device are provided. The piezoelectric device includes first and second electrodes disposed on a first surface of a piezoelectric layer; third and fourth electrodes disposed on a second surface of the piezoelectric layer, a first conductor electrically connecting the first and fourth electrodes, and a second conductor electrically connecting the second and third electrodes, in a cross-link with the first conductor.

10 Claims, 8 Drawing Sheets

PIEZOELECTRIC DEVICE AND METHOD OF MANUFACTURING THE SAME

RELATED APPLICATION

This application claims priority from Korean Patent Application No. 10-2013-0112066, filed on Sep. 17, 2013, in the Korean Intellectual Property Office, the disclosure of which is incorporated herein in its entirety by reference.

BACKGROUND

1. Field

The present disclosure relates to a piezoelectric device and a method of manufacturing the same, and more particularly, to a piezoelectric device with a cantilever structure and a method of manufacturing the same.

2. Description of the Related Art

A piezoelectric device is a device which generates electricity through deformation due to mechanical energy such as vibration, impact, or noise applied from the outside or which deforms due to electricity applied from the outside. A piezoelectric layer used in a piezoelectric device may have either a 31-mode structure in which electrodes are disposed on a top surface and a bottom surface of the piezoelectric layer and the piezoelectric layer is polarized along the thickness direction of the piezoelectric layer, or a 33-mode structure in which interdigital electrodes (or comb electrodes) are disposed on the top surface and on the bottom surface of the piezoelectric layer and the piezoelectric layer is polarized along the longitudinal direction of the piezoelectric layer.

A representative example of a piezoelectric device is a device with a cantilever structure using a bending feature of a piezoelectric transducer with a beam configuration. The piezoelectric device with this sort of cantilever structure is applicable to devices such as a piezoelectric energy harvester and a sensor using direct piezoelectricity and to devices such as a piezoelectric motor and an actuator using converse piezoelectricity.

SUMMARY

One or more exemplary embodiments provide a piezoelectric device with a cantilever structure and a method of manufacturing the same.

According to an aspect of an exemplary embodiment, a piezoelectric device comprises:

a piezoelectric layer wherein one side of the piezoelectric layer is fixed to a supporting member, and an electric energy is generated due to the deformation;

first and second electrodes disposed on a first surface of the piezoelectric layer;

third and fourth electrodes disposed on a second surface opposite to the first surface and in correspondence to the first and second electrodes;

a first conductor electrically connecting the first and fourth electrode; and a second conductor electrically connecting the second and third electrodes, in a cross-link with the first conductor.

The piezoelectric layer may include the beam configuration, and a 33-mode structure in which the polarization direction is parallel to the longitudinal direction of the piezoelectric layer.

The first and second electrodes may be alternately arranged on the first surface of the piezoelectric layer, and the third and fourth electrodes may be alternately arranged on the second surface of the piezoelectric layer. Each of the first, second, third, and fourth electrodes may include an interdigital electrode. In this case, the first and second electrodes may be arranged in an interdigitating formation, and the third and fourth electrodes may be arranged in an interdigitating formation. The third and fourth electrodes may be disposed at locations corresponding to locations of the first and second electrodes, respectively.

The piezoelectric layer may include a single piezoelectric body in a plate shape or a plurality of piezoelectric fibers. The piezoelectric layer may include inorganic material or organic material. When the piezoelectric layer is deformed according to the movement of the supporting member, an electric energy may be generated between the first conductor and the second conductor. Also, the piezoelectric layer is deformable by application of a predetermined electric energy between the first conductor and the second conductor.

To at least one of the first surface and the second surface of the piezoelectric layer, an inactive layer may be adhered. The other side of the piezoelectric layer may be connected to a mass. The first and second electrodes may be formed on a first substrate of a film type, and the third and fourth electrodes may be formed on second substrate of a film type.

According to an aspect of another exemplary embodiment, a manufacturing method of the piezoelectric device comprises:

disposing first and second electrodes on the first surface of the piezoelectric layer;

disposing third and fourth electrodes on the second surface of the piezoelectric layer, opposite to the first surface, in positions corresponding to positions of the first and second electrodes;

connecting the first electrode and the third electrode with a third conductor, then connecting the second electrode and the fourth electrode with a fourth conductor, and forming the polarization inside the piezoelectric layer by applying a direct electricity between the third and fourth conductors; and connecting the first electrode and the fourth electrode by a first conductor, and connecting the second electrode and the third electrode by a second conductor.

Additional exemplary aspects will be set forth in part in the description which follows and, in part, will be apparent from the description, or may be learned by practice of the presented embodiments.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
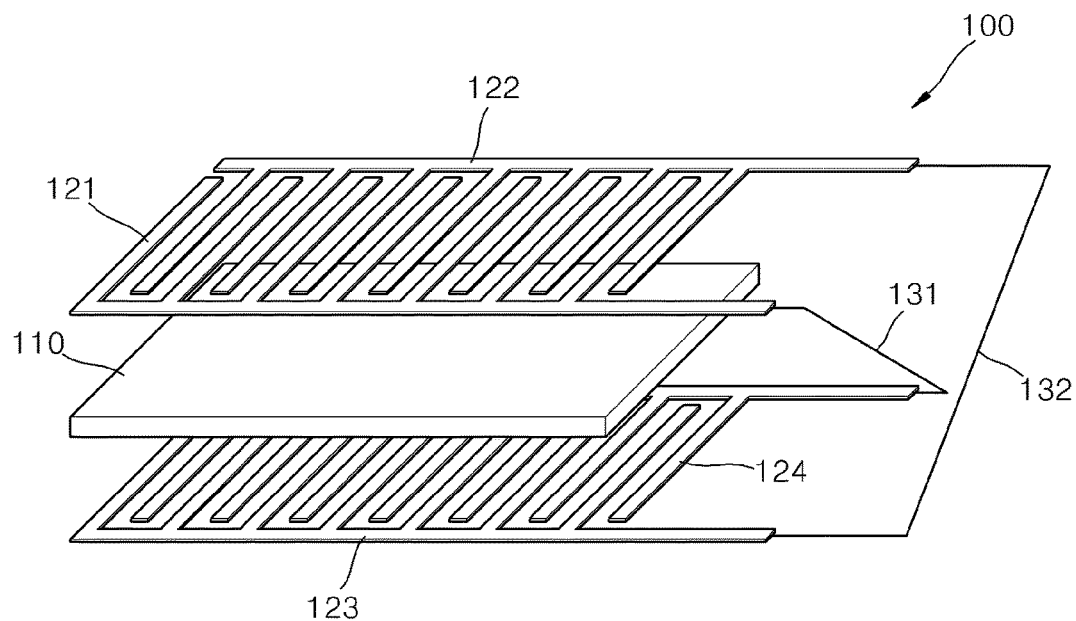
FIG. 1 illustrates a perspective view of a disassembled piezoelectric device according to an exemplary embodiment.

Reference will now be made in detail to exemplary embodiments illustrated in the accompanying drawings, wherein like reference numerals refer to like elements throughout. In this regard, the exemplary embodiments may have different forms and should not be construed as being limited to the descriptions set forth herein. Accordingly, exemplary embodiments are merely described below, by referring to the figures, to explain aspects of the present description. Also, when a certain material layer is explained to exist on a board or other layer, the material layer may exist in direct contact with the board or other layer, and another third layer may exist in-between. The material comprising each layer according to embodiments below of the present invention is illustrative only, and other different material may be used. A piezoelectric device explained below according to an exemplary embodiment may include a piezoelectric layer of a beam type, and be a cantilever-type device with one side fixed to a supporting member.

Figure 2:
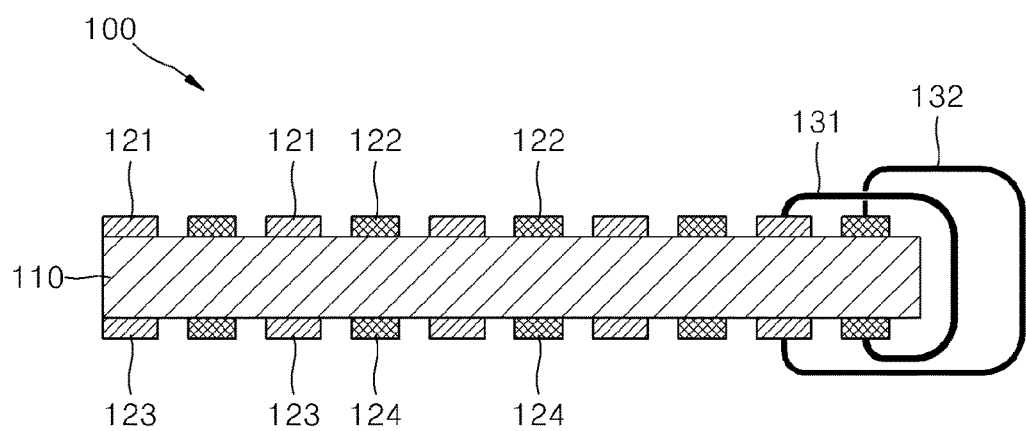
FIG. 2 illustrates a cross-section of the piezoelectric device illustrated in FIG. 1.

FIG. 1 illustrates a perspective view of a disassembled piezoelectric device 100 according to an exemplary embodiment. FIG. 2 illustrates a cross-section of the piezoelectric device 100 illustrated in FIG. 1.

Referring to FIGS. 1 and 2, the piezoelectric device 100 may include a piezoelectric layer 110, first and second electrodes 121 and 122 disposed on a first surface of the piezoelectric layer 110, and third and fourth electrodes 123 and 124 disposed on a second surface of the piezoelectric layer 110. The piezoelectric layer 110 generates electric energy due to deformation and may have the shape of a beam. The piezoelectric layer 110 may include a single piezoelectric body of a plate type. Alternately, the piezoelectric layer 110 may include a multiple number of piezoelectric fibers, and, in this case, the piezoelectric fibers may be arranged in parallel with a longitudinal direction of the piezoelectric layer. The piezoelectric layer 110 may have one side fixed to a supporting member, and the other side may be deformable due to up and down movement.

The material of the piezoelectric layer 110 may be inorganic material or organic material. For example, the piezoelectric layer 110 may include a material such as PZT, ZnO, SnO, PVDF, or P(VDF-FrFE), or any other of various materials. The piezoelectric layer 110 may have a 33-mode structure in which the polarization direction is parallel with the longitudinal direction of the piezoelectric layer 110. The piezoelectric layer 110 with the 33-mode structure, as described below, may have a predetermined direct voltage applied between the first and second electrodes 121 and 122, and the third and fourth electrodes 123 and 124, respectively.

On the first surface (for example, a top surface in FIG. 1) of the piezoelectric layer 110, the first and second electrodes 121 and 122 may be disposed in a relatively crossed arrangement. The first and second electrodes 121 and 122 may be interdigital electrodes, and, in this case, the first and second electrodes 121 and 122 may be alternately arranged in an interdigitating shape, as shown in FIG. 1. The first and second electrodes 121 and 122 may include a conductive material. For example, the first and second electrodes 121 and 122 may include metal such as Ag, Al, Cu, or Au. Also, the first and second electrodes 121 and 122 may include graphene, Carbon NanoTubes (CNTs), Induium Tin Oxide (ITO), or a conductive polymer On the second surface (for example, a bottom surface o in FIG. 1) of the piezoelectric layer 110, the third and fourth electrodes 123 and 124 may be disposed in a relatively crossed arrangement. In this case, the third electrode 123 may be disposed in correspondence with the first electrode 121, and the fourth electrode 124 may be disposed in correspondence with the second electrode 122. The third electrode 123 may have a shape corresponding to the shape of the first electrode 121, and may be positioned on the lower portion of the first electrode 121. Also, the fourth electrode 124 may have a shape corresponding to the shape of the second electrode 122, and may be positioned on the lower portion of the second electrode 122. The third and fourth electrodes 123 and 124, like the first and second electrodes 121 and 122, may include interdigital electrodes, and in this case, the third and fourth electrodes 123 and 124 may be disposed in an interdigitating shape, as shown in FIG. 1. The distance between the third and fourth electrodes 123 and 124 may be the same as the distance between the first and second electrodes 121 and 122. The third and fourth electrodes 123 and 124, like the first and second electrodes 121 and 124121 and 122, may include a conductive material.

The first, second, third, and fourth electrodes 121, 122 and 123, and 124 may be electrically connected crossways according to an exemplary embodiment. In more detail, the first and fourth electrodes 121 and 124 may be electrically connected by a first conductor 131, and the second and third electrodes 122 and 123 may be electrically connected by a second conductor 132. The first conductor 131 and the second conductor 132 may cross each other spatially. When the first and fourth electrodes 121 and 124 are electrically connected, and the second and third electrodes 122 and 123 are electrically connected, an electric energy with a higher efficiency may be generated as described below.

Figure 3A:
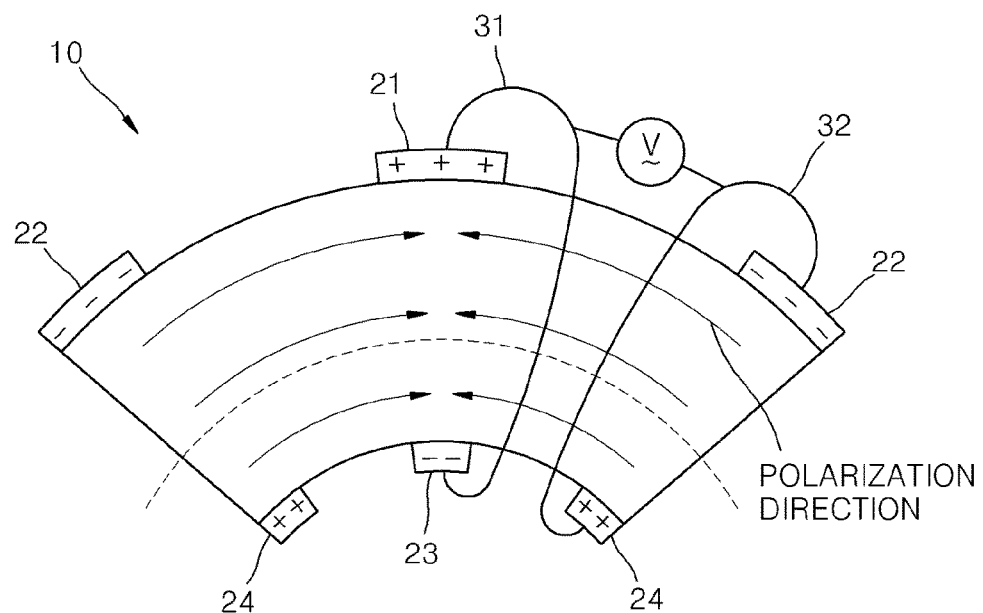
FIGS. 3A and 3B, illustrate the comparison of the movement process of a related-art piezoelectric device and the movement process of the piezoelectric device illustrated in FIG. 1.
Figure 3B:
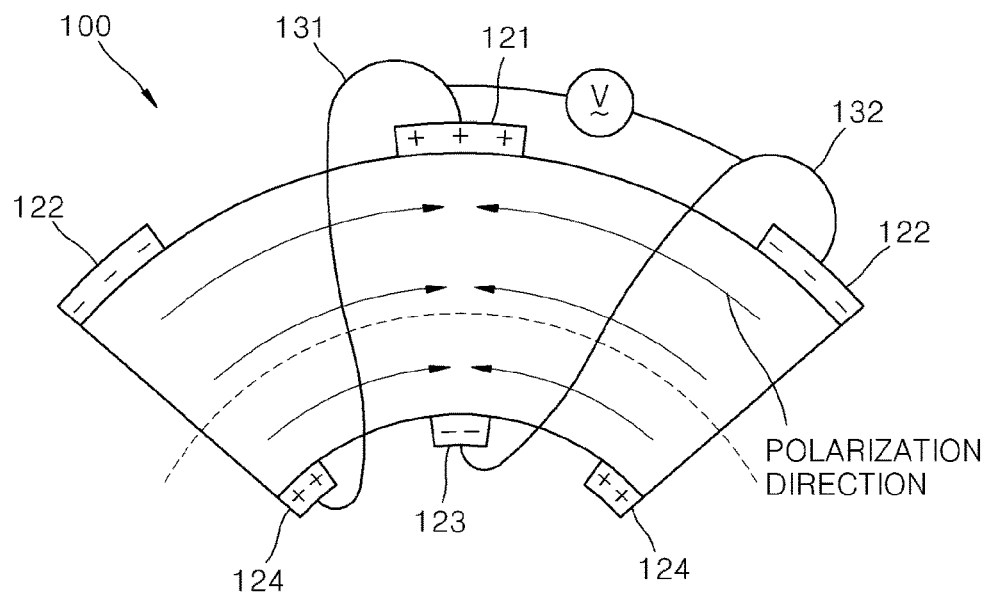

FIGS. 3A and 3B3A, illustrate comparison diagrams to describe the movement process of a related-art piezoelectric device 10 and the movement process of the piezoelectric device 100 illustrated in FIG. 1 according to an exemplary embodiment. FIG. 3A illustrates the bending state of the related-art piezoelectric device 10, and in this case, first and third electrodes 21 and 23 are electrically connected by a first conductor 31, and second and fourth electrodes 22 and 24 are electrically connected by a second conductor 32. Also, FIG. 3B illustrates the bending state of the piezoelectric device 100 according to an exemplary embodiment, and in this case, the first and fourth electrodes 121 and 124 are electrically connected by the first conductor 131, and the second and third electrodes 122 and 123 are electrically connected by the second conductor 132.

Referring to FIG. 3A, when a related-art piezoelectric device 10 is in a bent state, electric charges with relatively opposite polarity gather at the first and third electrodes 21 and 23 which are connected by the first conductor 31, and electric charges with relatively opposite polarity gather at the second and fourth electrodes 22 and 24 which are connected by the second conductor 32. Accordingly, between the first and second conductors 31 and 32 a relatively small voltage V1 may be induced. In the other hand, referring to FIG. 3B, when the piezoelectric device 100 is in a bent state according to an exemplary embodiment, electric charges with relatively same polarity, a positive polarity (+) as an example, gather at the first and fourth electrodes 121 and 124 which are connected by the first conductor 131, and electric charges with relatively same polarity, a negative polarity (−) as an example, gather at the second and third electrodes 122 and 123 which are connected by the second conductor 132. Accordingly, a voltage V between the first conductor 131 and the second conductor 132, which is higher than the voltage V1 induced by the related-art piezoelectric device 10, may be induced. As described above, in the piezoelectric device 100 according to an exemplary embodiment, when the piezoelectric layer 110 is in a bent state, electrodes where electric charges with relatively same polarity gather are connected in a cross-link. In other words, when the piezoelectric layer 110 is in a bent state, for example, the first and fourth electrodes 121 and 124, where positive electric charges gather, are connected by the first conductor 131, and the second and third electrodes 122 and 123, where negative electric charges gather, are connected by the second conductor 132 in a cross-link with the first conductor 131. In this manner, electric energy may be generated more efficiently.

Figure 4:
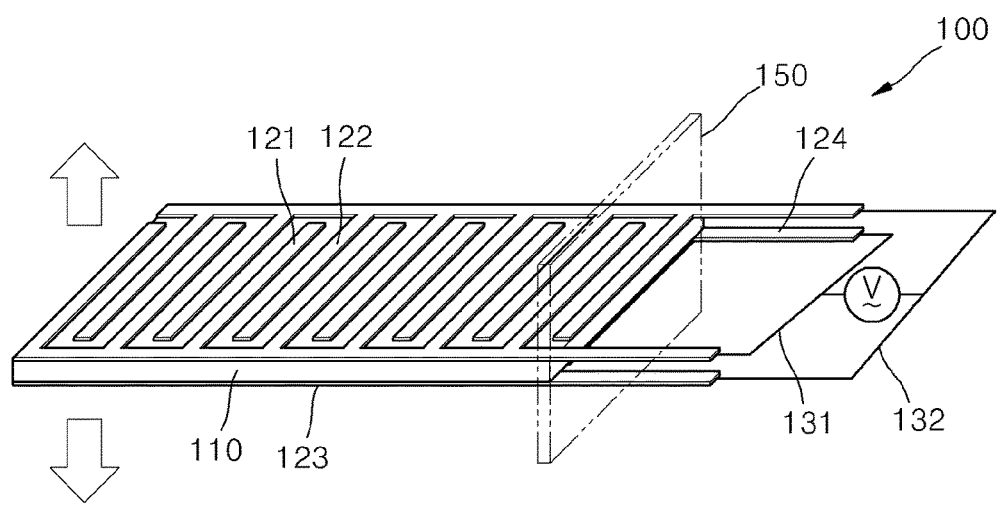
FIG. 4 illustrates a process of generating electricity, while one side of the piezoelectric device is fixed to a supporting member as illustrated in FIG. 1, by moving the other side of the piezoelectric device upward and downward.

FIG. 4 illustrates a state in which one side of the piezoelectric device 100 is fixed to a supporting member 150 according to an exemplary embodiment as illustrated in FIG. 1. Referring to FIG. 4, in the state in which one side of the piezoelectric device 100 is fixed to the supporting member 150, when the other side of the piezoelectric device 100 moves up and down, the piezoelectric layer 110 may be moved through a bent state. Also, when the supporting member 150 moves up and down, the other side of the piezoelectric device 100 moves up and down, and accordingly, the piezoelectric layer 110 may be moved through a bent state. When the piezoelectric layer 110 is in a bent state as described, a voltage V may be induced between the first conductor 131 connecting the first and fourth electrodes 121 and 124 and the second conductor 132 connecting the second and third electrodes 122 and 123. When the piezoelectric device 100 generates electric energy due to deformation in this manner, the piezoelectric device 100, for example, may be applied to devices such as a piezoelectric energy harvester and a sensor utilizing direct piezoelectricity.

Figure 5A:
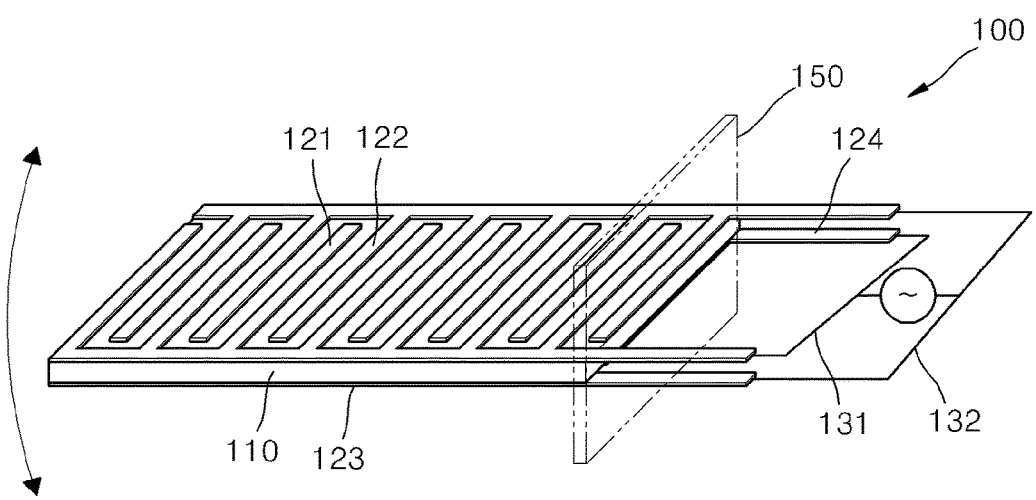
FIG. 5A illustrates the movement of the other side of the piezoelectric device by applying an alternate voltage between the first conductor and the second conductor of the piezoelectric device illustrated in FIG. 1.
Figure 5B:
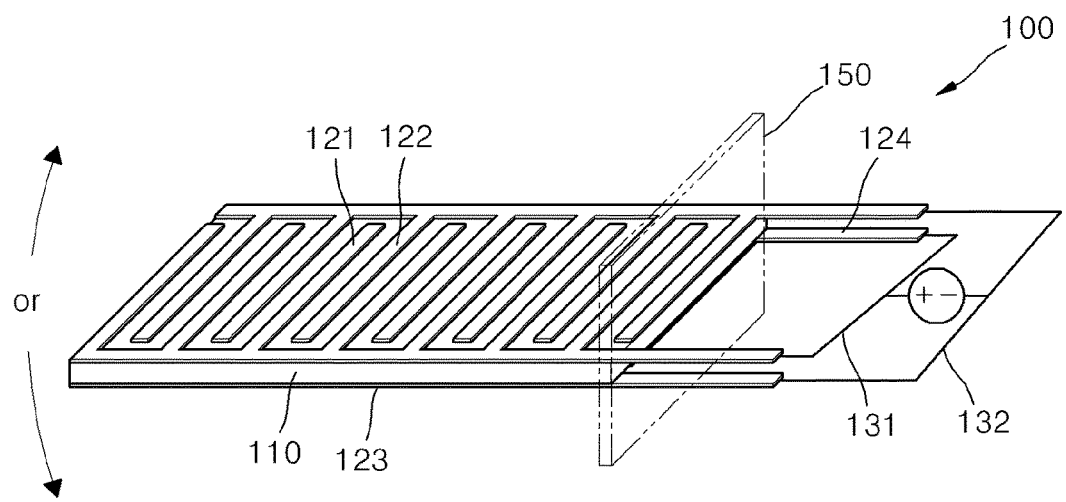
FIG. 5B illustrates the movement of the other side of the piezoelectric device by applying a direct voltage between the first conductor and the second conductor of the piezoelectric device illustrated in FIG. 1.

FIGS. 5A and 5B illustrate the movement of the other side of the piezoelectric device 100 by applying a voltage to the piezoelectric device 100 illustrated in FIG. 1 according to an exemplary embodiment. In detail, referring to FIG. 5A, when an alternating voltage is applied between the first conductor 131 and the second conductor 132 of the piezoelectric device 100 according to an exemplary embodiment, the other side of the piezoelectric device 100 may move up and down. Also, referring to FIG. 5B, when a direct voltage is applied between the first conductor 131 and the second conductor 132 of the piezoelectric device 100 according to an exemplary embodiment, the other side of the piezoelectric device 100 may move either up or down. When the piezoelectric device 100 produces deformation due to an application of electric energy in this manner, the piezoelectric device 100 may be applied to devices such as a piezoelectric motor and an actuator utilizing converse piezoelectricity.

Figure 6A:
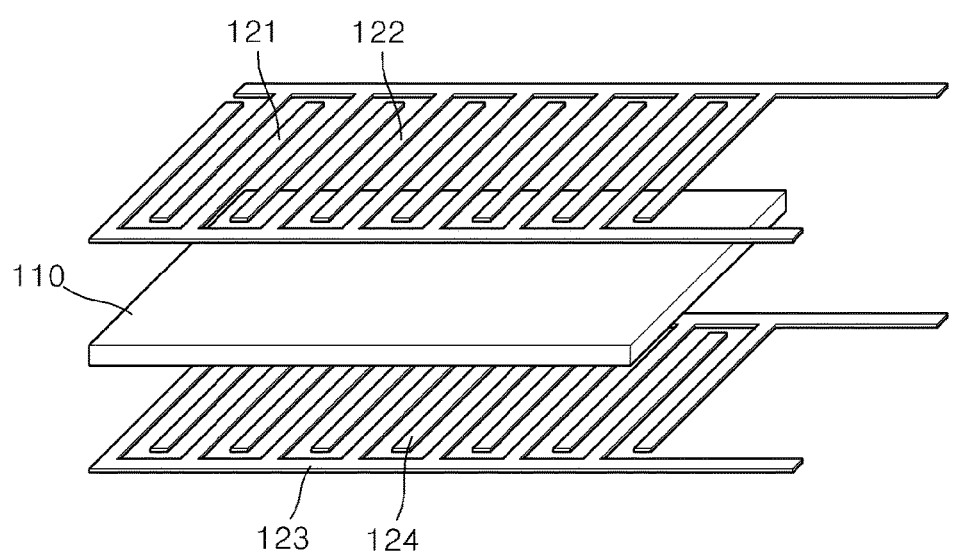
FIGS. 6A, 6B, and 6C illustrate diagrams to explain a manufacturing method of a piezoelectric device, according to another exemplary embodiment.
Figure 6B:
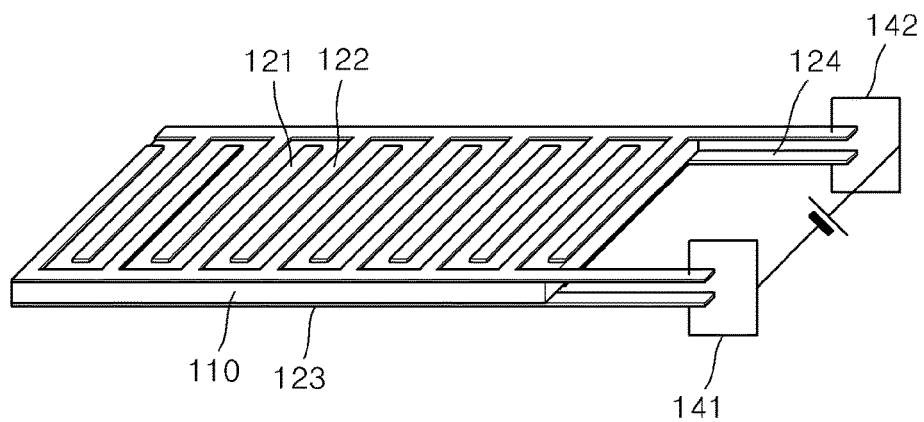
Figure 6C:
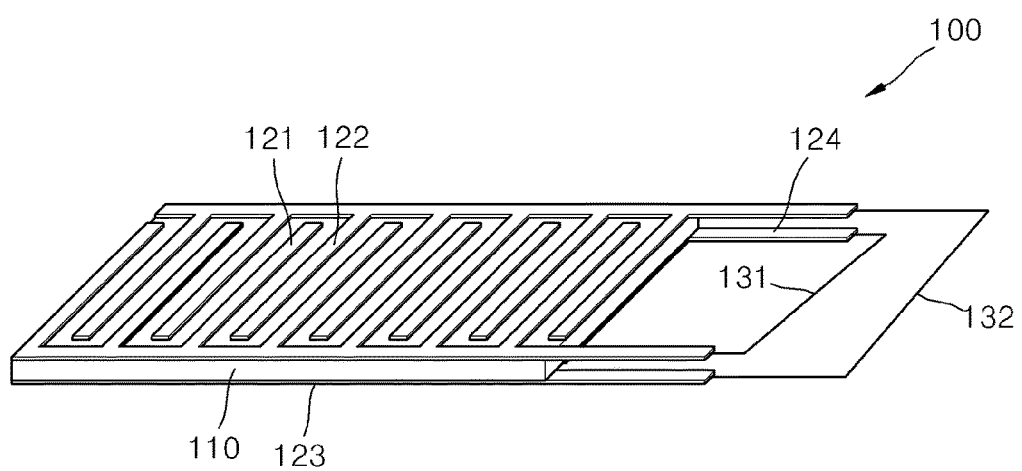

FIGS. 6A through 6C illustrate diagrams describing a manufacturing method of the piezoelectric device 100, according to another exemplary embodiment. FIGS. 6A through 6C illustrate the process of manufacturing the piezoelectric device 100 illustrated in FIG. 1.

Referring to FIG. 6A, the first and second electrodes 121 and 122 are formed on the first surface (the top surface in FIG. 6A) of the piezoelectric layer 110, and the third and fourth electrodes 123 and 124 are formed on the second surface (the bottom surface in FIG. 6A) of the piezoelectric layer 110. The piezoelectric layer 110 may have a beam shape. The first and second electrodes 121 and 122 may be alternately arranged on the first surface of the piezoelectric layer 110, and the third and fourth electrodes 123 and 124 may be alternately arranged on the second surface of the piezoelectric layer 110. The third and fourth electrodes 123 and 124 may be arranged in correspondence with the first and second electrodes 121 and 122, respectively. The first, second, third, and fourth electrodes 121, 122, 123, and 124 may be interdigital electrodes. In this case, the first and second electrodes 121 and 122 may be arranged in an interdigitating shape, and the third and fourth electrodes 123 and 124 may be arranged in an interdigitating shape. The first and second electrodes 121 and 122 may include a conductive material. The first and second electrodes 121 and 122 may be formed on the first surface of the piezoelectric layer 110 by depositing or printing, and the third and fourth electrodes 123 and 124 may be formed on the second surface of the piezoelectric layer 110 by depositing or printing. On the other hand, as described below, a first substrate 191 (see FIG. 11), on which the first and second electrodes 121 and 122 are formed, may be attached to the first surface of the piezoelectric layer 110, and a second substrate 192 (see FIG. 11), on which the third and fourth electrodes 123 and 124 are formed, may be attached to the second surface of the piezoelectric layer 110. The first and second substrates 191 and 192 may include plastic films.

Referring to FIG. 6B, the first and third electrodes 121 and 123 may be connected by a third conductor 141, and the second and fourth electrodes 122 and 124 may be connected by a fourth conductor 142. Afterwards, when a direct voltage is applied between the third conductor 141 and the fourth conductor 142, a polarization inside of the piezoelectric layer 110 between the first and second electrodes 121 and 122, and between the third and fourth electrodes 123 and 124, may be formed in a direction parallel to the longitudinal direction of the piezoelectric layer 110. Accordingly, the piezoelectric layer 110 may have a 33-mode structure. After the polarization inside the piezoelectric layer 110 is formed in a direction parallel to the longitudinal direction of the piezoelectric layer 110, the third conductor 141 connecting the first and third electrodes 121 and 123 and the fourth conductor 142 connecting the second and fourth electrodes 122 and 124 are removed.

Referring to FIG. 6C, the first and fourth electrodes 121 and 124 are electrically connected by the first conductor 131, and the second and third electrodes 122 and 123 are electrically connected by the second conductor 132, and then the piezoelectric device 100 is completed. At this stage, the first conductor 131 and the second conductor 132 may form a cross-link. When the piezoelectric layer 110 of the piezoelectric device 100 which is completed in this manner is deformed, a voltage may be induced between the first and second conductors 131 and 132, and electric energy may be generated.

Figure 7:
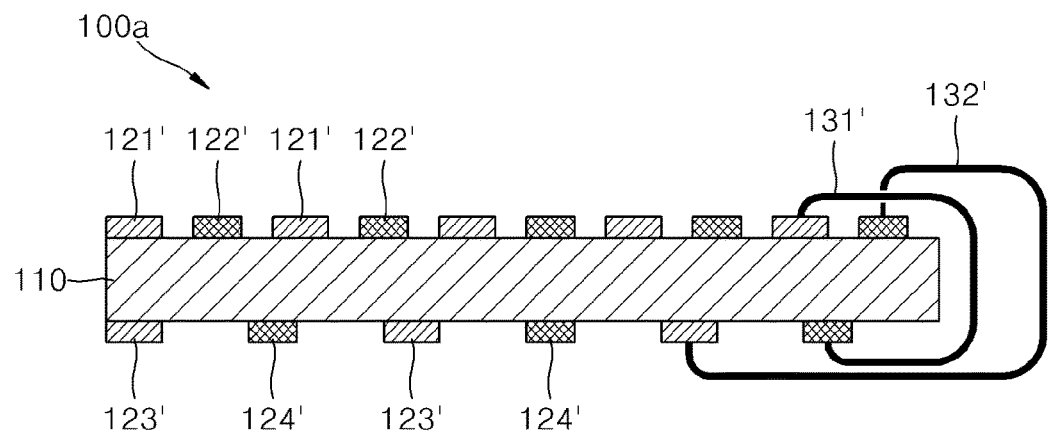
FIG. 7 illustrates a cross-section of a piezoelectric device according to another exemplary embodiment.

FIG. 7 illustrates a cross-section of a piezoelectric device 100a according to another exemplary embodiment. Only differences from the previously described exemplary embodiments are described below.

Referring to FIG. 7, on the first surface of the piezoelectric layer 110, first and second electrodes 121' and 122' are alternately disposed, and on the second surface of the piezoelectric layer 110, third and fourth electrodes 123' and 124' are alternately disposed. The third and fourth electrodes 123' and 124' may be arranged in correspondence with the first and second electrodes 121' and 122', respectively. According to the previous exemplary embodiments, the third and fourth electrodes 123 and 124 are arranged in correspondence with the first and second electrodes 121 and 122, respectively, thus, the distance between the first and second electrodes 121 and 122 is the same as the distance between the third and fourth electrodes 123 and 124. In contrast, in this exemplary embodiment, the distance between the third and fourth electrodes 123' and 124' is different from the distance between the first and second electrodes 121' and 122'. As such, according to the circumstance when the piezoelectric layer 110 is deformed, the distance between the first and second electrodes 121' and 122' and the distance between the third and fourth electrodes 123' and 124' may vary.

Figure 8:
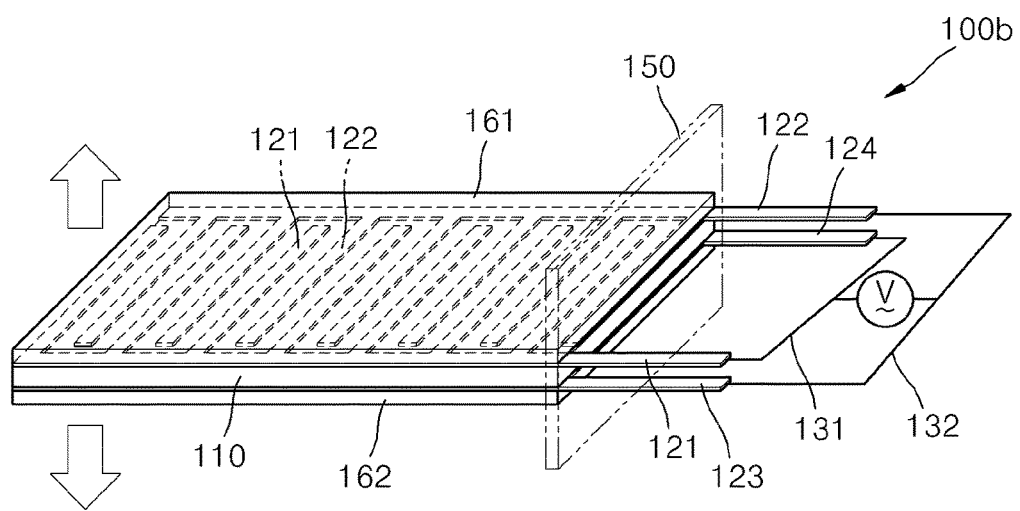
FIG. 8 illustrates a perspective view of a piezoelectric device according to another exemplary embodiment.

FIG. 8 illustrates a perspective view of a piezoelectric device 100b according to another exemplary embodiment. Only differences from the previously described exemplary embodiments are described below.

Referring to FIG. 8, on the first surface of the piezoelectric device 110, the first and second electrodes 121 and 122 are alternately arranged, and on the second surface of the piezoelectric device 110, the third and fourth electrodes 123 and 124 are alternately arranged. One side of the piezoelectric device 110 is fixed by a supporting member 150. The first and fourth electrodes 121 and 124 are electrically connected by the first conductor 131, and the second and third electrodes 122 and 123 are electrically connected by the second conductor 132. The descriptions of the piezoelectric layer 110, the first, second, third, and fourth electrodes 121 and 122 and 123123 and 124, and the first and second conductors 131, 132 are the same as those of the previously described exemplary embodiment, and thus a repeated description thereof is omitted.

On the first and second electrodes 121 and 122, a first inactive layer 161 without piezoelectric characteristics is disposed, and on the third and fourth electrodes 123 and 124, a second inactive layer 162 without piezoelectric characteristics is disposed. The first inactive layer 161 may be attached to the first surface of the piezoelectric layer 110 to cover the first and second electrodes 121 and 122, and the second inactive layer 162 may be attached to the second surface of the piezoelectric layer 110 to cover the third and fourth electrodes 123 and 124. The first and second inactive layers 161 and 162 may play a role of controlling the rigidity of the piezoelectric device 100b or protecting the piezoelectric device 100b. When the first and second inactive layers 161 and 162 include materials with high rigidity such as SUS, the first and second inactive layers 161 and 162 may be able to control the amount of deformation of the piezoelectric layer 110. Also, when the first and second inactive layers 161 and 162 include materials such as plastic, the first and second inactive layers 161 and 162 may protect the piezoelectric layer 110 and the first, second, third, and fourth electrodes 121, 122, 123, and 124.

Figure 9:
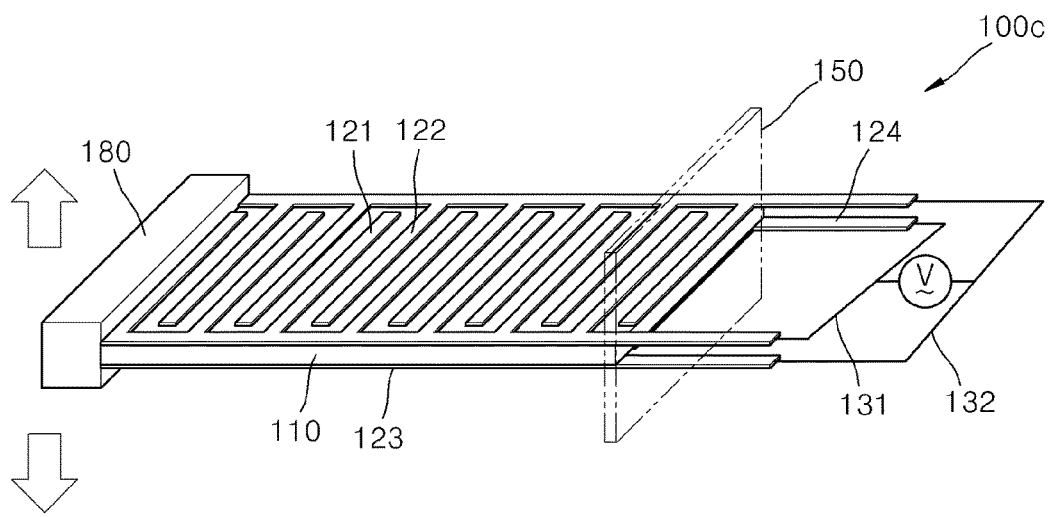
FIG. 9 illustrates a perspective of view a piezoelectric device according to another exemplary embodiment.

FIG. 9 illustrates a perspective view of a piezoelectric device 100c according to another exemplary embodiment. Only differences from the previously described exemplary embodiments are described below.

Referring to FIG. 9, on the first surface of the piezoelectric layer 110, the first and second electrodes 121 and 122 are alternately arranged, and on the second surface of the piezoelectric layer 110, the third and fourth electrodes 123 and 124 are alternately arranged. One side of the piezoelectric layer 110 is fixed to a supporting member 150. The first and fourth electrodes 121 and 124 are electrically connected by the first conductor 131, and the second and third electrodes 122 and 123 are electrically connected by the second conductor 132. The description of the piezoelectric layer 110, the first, second, third, and fourth electrodes 121, 122, 123, and 124, and the first and second conductors 131 and 132 are the same as those of the previously described exemplary embodiment, and thus, a repeated description thereof is omitted.

At the other side of the piezoelectric layer 110 is a mass 180 with a predetermined weight. In a state in which the mass 180 is arranged at the other side of the piezoelectric layer 110, when the supporting member 150 vibrates due to an external force, the mass 180 may generate a regular oscillation and may accordingly generate electric energy more efficiently.

Figure 10:
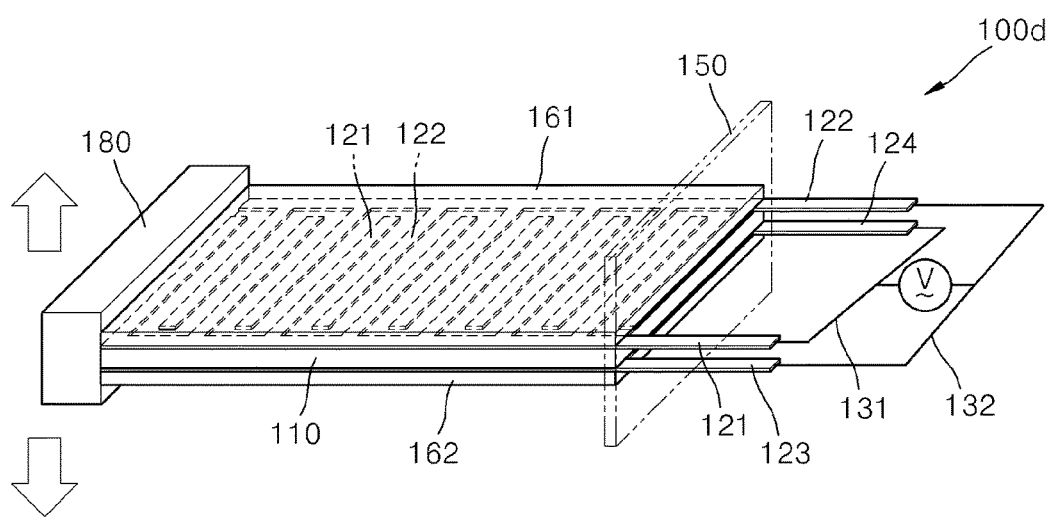
FIG. 10 illustrates a perspective view of a piezoelectric device according to another exemplary embodiment.

FIG. 10 illustrates a perspective view of a piezoelectric device 100d according to another exemplary embodiment. Only differences from the previously described exemplary embodiments are described below.

Referring to FIG. 10, on the first surface of the piezoelectric layer 110, the first and second electrodes 121 and 122 are alternately arranged, and on the second surface of the piezoelectric layer 110, the third and fourth electrodes 123 and 124 are alternately arranged. One side of the piezoelectric layer 110 is fixed to a supporting member 150. The first and fourth electrodes 121 and 124 are electrically connected by the first conductor 131, and the second and third electrodes 122 and 123 are electrically connected by the second conductor 132. The description of the piezoelectric layer 110, the first, second, third, and fourth electrodes 121, 122, 123, and 124, and the first and second conductors 131 and 132 are the same as those of the previously described exemplary embodiments, and thus, a repeated description thereof is omitted On the first and second electrodes 121 and 122, a first inactive layer 161 without piezoelectric characteristics is prepared, and on the third and fourth electrodes 123 and 124, a second inactive layer 162 without piezoelectric characteristics is prepared. The first inactive layer 161 may be attached to the first surface of the piezoelectric layer 110 to cover the first and second electrodes 121 and 122, and the second inactive layer 162 may be attached to the second surface of the piezoelectric layer 110 to cover the third and fourth electrodes 123 and 124. The first and second inactive layers 161 and 162 may control the rigidity of the piezoelectric device 100d or protect the piezoelectric device 100d. Also, a mass 180 with a predetermined weight is arranged at the other side of the piezoelectric layer 110, and electric energy may be generated more efficiently.

Figure 11:
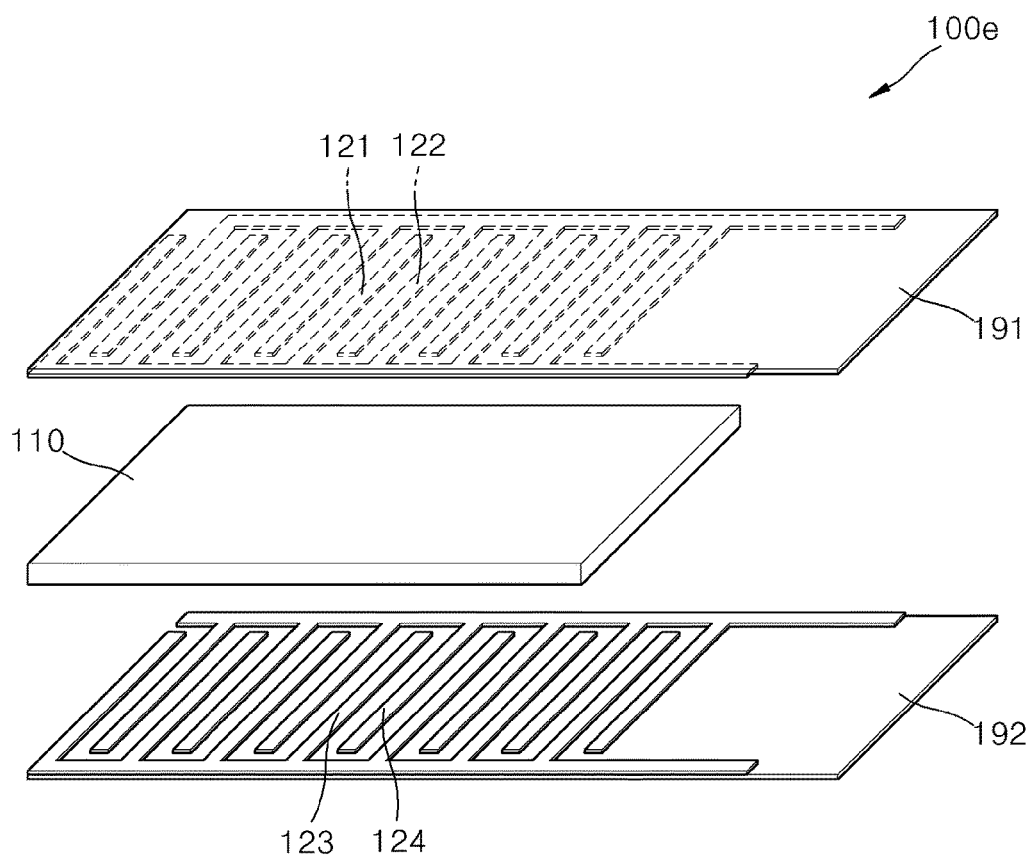
FIG. 11 illustrates a perspective view of a disassembled piezoelectric device according to another exemplary embodiment.

FIG. 11 illustrates a perspective view of a piezoelectric device 100e according to another exemplary embodiment.

Only differences from the previously described exemplary embodiments are described below.

Referring to FIG. 11, the first and second electrodes 121 and 122 are formed on the first substrate 191. The first and second electrodes 121 and 122 may be alternately arranged on a bottom surface of the first substrate 191. The first substrate 191 may include a plastic film. The first substrate 191, on which the first and second electrodes 121 and 122 are formed, may be attached to the first surface (the top surface) of the piezoelectric layer 110. Also, the third and fourth electrodes 123 and 124 are formed on the second substrate 192. The third and fourth electrodes 123 and 124 may be alternately arranged on a top surface of the second substrate 192. The second substrate 192 may include, for example, a plastic film. The second substrate 192, on which the third and fourth electrodes 123 and 124 are formed, may be attached to the second surface (the bottom surface) of the piezoelectric layer 110.

According to one or more exemplary embodiments, a piezoelectric device may generate electric energy more efficiently by connecting electrodes, where electric charges with relatively same polarity gather at the time of bending of a piezoelectric layer, in a cross-link by conductors. The piezoelectric device may be applied to an energy harvester, a sensor, and others where electric energy is generated due to deformation, or a piezoelectric motor, an actuator, and others where deformation is produced by applying electric energy.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A piezoelectric device comprising:
   a supporting member;
   a piezoelectric layer which generates electric energy upon deformation, wherein a first side of the piezoelectric layer is fixed to the supporting member, and a second side of the piezoelectric layer, opposite the first side of the piezoelectric layer, is not fixed to move freely with respect to the supporting member;
   a first electrode and a second electrode disposed on a first surface of the piezoelectric layer;
   a third electrode and a fourth electrode disposed on a second surface of the piezoelectric layer, opposite the first surface of the piezoelectric layer, wherein the third electrode disposed in a position corresponding to a position of the first electrode, and the fourth electrode is disposed in a position corresponding to a position of the second electrode;
   a first conductor electrically connecting the first electrode and the fourth electrode; and
   a second conductor, electrically connecting the second electrode and the third electrode.

2. The piezoelectric device of claim 1, wherein the first and the second electrodes correspond to first interdigital electrodes, the third and the fourth electrodes correspond to second interdigital electrodes, the first surface corresponds to a top surface of the piezoelectric layer, and the second surface corresponds to a bottom surface of the piezoelectric layer,
   wherein the piezoelectric layer has a beam shape and a 33-mode structure in which the first interdigital electrodes are disposed on the top surface of the piezoelectric layer, the second interdigital electrodes are disposed on the bottom surface of the piezoelectric layer, and a polarization direction of the piezoelectric layer is parallel with a longitudinal direction of the piezoelectric layer.

3. The piezoelectric device of claim 2, wherein the first electrode and the second electrode are alternately arranged on the first surface of the piezoelectric layer, and the third electrode and the fourth electrode are alternately arranged on the second surface of the piezoelectric layer.

4. The piezoelectric device of claim 1, wherein the piezoelectric layer comprises a single piezoelectric body comprising one of a plate shape and a plurality of piezoelectric fibers.

5. The piezoelectric device of claim 1, wherein the piezoelectric layer comprises one of inorganic material and organic material.

6. The piezoelectric device of claim 1, wherein electric energy is generated between the first conductor and the second conductor by a bending of the piezoelectric layer according to a movement of the supporting member.

7. The piezoelectric device of claim 1, wherein the piezoelectric layer is bent by application of a predetermined electric energy between the first conductor and the second conductor.

8. The piezoelectric device of claim 1, wherein an inactive layer is adhered to at least one of the first surface and the second surface of the piezoelectric layer.

9. The piezoelectric device of claim 1, wherein a mass is connected to the second side of the piezoelectric layer.

10. The piezoelectric device of claim 1, wherein the first electrode and the second electrode are formed on a first substrate of a film type and the third electrode and the fourth electrode are formed on a second substrate of a film type.

* * * * *